(12) United States Patent
Kuramoto (10) Patent No.: US 6,937,345 B2
(45) Date of Patent: Aug. 30, 2005

(54) MEASURING SYSTEM FOR MEASURING PERFORMANCE OF IMAGING OPTICAL SYSTEM

(75) Inventor: Yoshiyuki Kuramoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 94 days.

(21) Appl. No.: 09/901,087

(22) Filed: Jul. 10, 2001

(65) Prior Publication Data

US 2002/0057495 A1 May 16, 2002

(30) Foreign Application Priority Data

Jul. 10, 2000 (JP) ........................................ 2000-208680

(51) Int. Cl.⁷ .............................................. G01B 11/02
(52) U.S. Cl. ...................................................... 356/515
(58) Field of Search ................................ 356/515, 512, 356/124

(56) References Cited

U.S. PATENT DOCUMENTS

| | | | | |
|---|---|---|---|---|
| 5,815,268 A | * | 9/1998 | LaFleur | 356/515 |
| 5,838,442 A | * | 11/1998 | Bray | 356/512 |
| 5,898,501 A | * | 4/1999 | Suzuki et al. | 356/511 |
| 6,473,186 B2 | * | 10/2002 | Kawasaki et al. | 356/512 |
| 6,480,284 B1 | * | 11/2002 | Stenton | 356/458 |
| 6,614,535 B1 | * | 9/2003 | Kakuchi et al. | 356/515 |
| 2001/0001577 A1 | * | 5/2001 | Ukaji | 356/500 |

* cited by examiner

Primary Examiner—Edward J. Glick
Assistant Examiner—Thomas R Artman
(74) Attorney, Agent, or Firm—Fitzpatrick, Cella, Harper & Scinto (57) ABSTRACT

A measuring system, for measuring performance of an imaging optical system by use of an interferometer, includes (i) an interferometer arranged to measure transmission wavefronts separately or sequentially, in relation to at least one of plural measurement points defined along a plane perpendicular to an optical axis of the imaging optical system, wherein position coordinates of object side and image side imaging points of the plural measurement points are measured, and (ii) a computing unit being communicated with the interferometer. The computing unit is operable to calculate a wavefront as measured by the interferometer and at least one of a wavefront aberration and an imaging state of the imaging optical system, and to correct a measured value related to at least one of a wavefront aberration and an imaging state of the imaging optical system at another measurement point, while taking, as a reference, at least one of a wavefront aberration and an imaging state at a standard point set along a plane perpendicular to the optical axis.

42 Claims, 7 Drawing Sheets

MEASURING SYSTEM FOR MEASURING PERFORMANCE OF IMAGING OPTICAL SYSTEM

FIELD OF THE INVENTION AND RELATED ART

This invention relates to a measuring method and a measuring system for measuring the performance of an imaging optical system. More particularly, the invention concerns high precision measurement of distortion and field curvature of an imaging optical system.

Conventionally, high precision measurement of distortion and curvature of field of an imaging optical system such as an imaging lens used in a projection exposure apparatus, is based on two methods such as follows.

Figure 6:
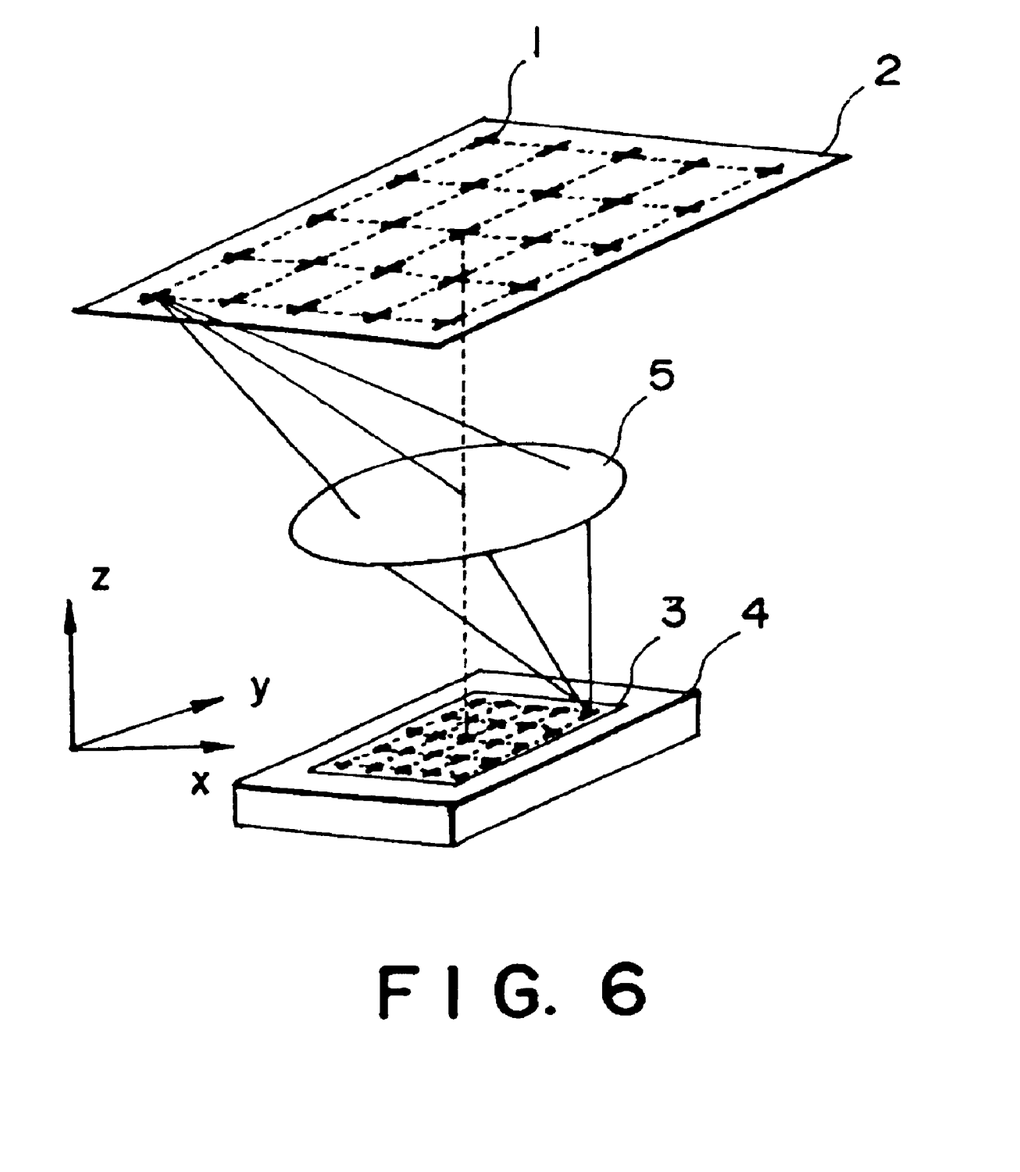
FIG. 6 is a schematic view for explaining a first conventional measuring method.

FIG. 6 shows a first measurement method in which a plurality of patterns 1 of the same shape, formed on a reference sample 2 at positions corresponding to the view angle of a lens 5 to be inspected, are projected by the lens 5 onto a photosensitive member as reference patterns. The photosensitive member having the patterns transferred thereto is then subjected to a development process, whereby images of the reference patterns are made visible upon the photosensitive member.

The transferred and developed images of the reference patterns on the photosensitive member are then subjected to a measurement process for measuring absolute position coordinates (Xi, Yi) ("i" is the pattern number). The absolute position coordinates measurement is based on observation using a microscope, for example. From the measured position coordinates (Xi, Yi) of each patterns thus obtained and the idealistic position coordinates (X0i, Y0i) of these patterns, the imaging position errors (Dxi, Dyi), that is, distortion, can be calculated in accordance with the following equations:

$$Dxi=Xi-X0i \text{ and } Dyi=Yi-Y0i$$

In the measurement of curvature of field, after the reference patterns mentioned above are once transferred, the photosensitive member 3 is moved in X and Y directions (directions orthogonal to the optical axis of the lens to be inspected), by moving a three-axis stage 4 shown in FIG. 6. The movement amount in the X and Y directions is made larger than the size of each reference pattern image but smaller than the spacing of two adjacent reference pattern images. Subsequently, while keeping the coordinates (X, Y) of the stage, the stage is moved in a Z-axis direction (optical axis direction), by which the photosensitive member 3 is moved out of focus with the image plane of the lens. Then, plural reference patterns are transferred to the photosensitive member.

The sequential procedure of X, Y and Z stage motions and pattern transfer operation described above is repeated until a necessary defocus amount is accomplished. After the printing operation under the last defocus-condition is completed, like the distortion measurement described hereinbefore, the photosensitive member 3 is developed, whereby transferred images of the reference patterns are produced.

In this manner, in the measurement of curvature of field, in relation to each view angle position, images of reference patterns are transferred to a single photosensitive member, under different defocus conditions. With respect to each view angle position, by comparing transferred defocus images, a sharpest image is chosen and the corresponding defocus position is determined as the image plane position. The comparison of the reference pattern images is based on observation using a microscope, for example. Then, the image plane positions determined at each view angle positions are compared with each other, by which the curvature of field inside the view angle of the lens 5 to be inspected can be obtained.

Figure 7:
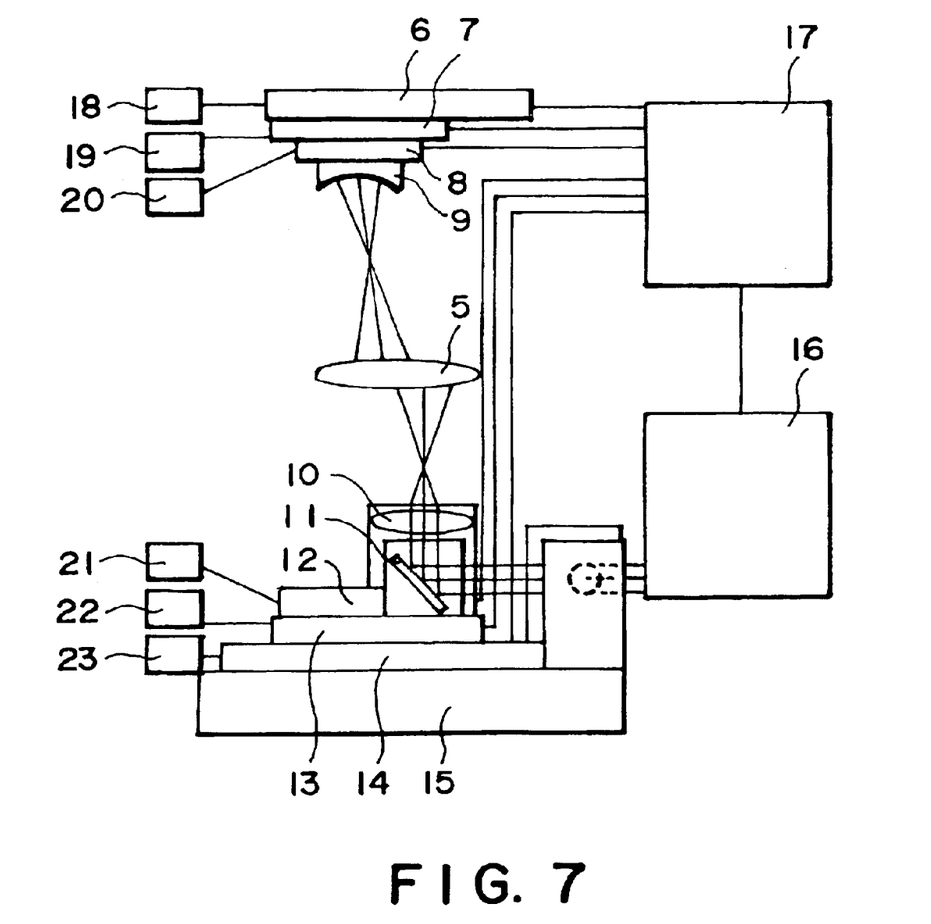
FIG. 7 is a schematic view for explaining a second conventional measuring method.

FIG. 7 shows a second measuring method which uses an interferometer in place of transferred images.

The structure of FIG. 7 is what can be called a Fizeau type interferometer, and it comprises a transmission sphere lens (TS lens) 10 whose final surface is used as a reference surface, and a reflectance sphere mirror (RS mirror) 9, and so on.

Parallel light emitted from a major assembly of the interferometer is reflected by a fixed mirror, mounted on a base table, in a direction of the depth of the sheet of the drawing (i e., forwardly in the drawing). The reflected light is then reflected by a mirror which is disposed on a TS lens driving Y stage 14 and, thereafter, it is reflected by another mirror 11 mounted on a TS lens driving X stage 13. The light is then incident on the TS lens 10 which is mounted on a TS lens driving Z stage 12. The light passing through the TS lens 10 is converged upon a rear focal plane of the TS lens 10, wherein the point of convergence is defined to be registered approximately with the image plane of the lens 5 to be inspected. After this, the light passing through the lens 5 is collected again on the object plane.

Here, the RS mirror 9 is disposed so that the curvature center thereof coincides approximately with the point of convergence of the light upon the object plane of the lens 5. The light incident on the RS mirror 9 goes backwardly along its oncoming path, and it enters the interferometer major assembly 6 as a detection wave. On the other hand, a portion of the light incident on the TS lens 10 is reflected by the reference surface of the TS lens 10, and it goes backwardly along its oncoming path, such that it enters the interferometer major assembly 16 as a reference wave.

Based on the detection wave and the reference wave thus entered, an interference fringe is produced in the interferometer major assembly 16. Precise measurement based on a fringe scan method, for example, is performed to measure the interference fringe, and calculation of the transmission wavefront at the measurement image point of the lens 5 is executed.

Distance measuring unit 18–23 measure the position coordinates (TSXi, TSYi, TSZi) of the TS lens 10 adjacent its rear focal point, in the transmission wavefront measurement, as well as the position coordinates (RSXi, RSYi, RSZi) of the RS mirror 9 adjacent its curvature center. The measurement may use a distance measuring gauge or an encoder, for example.

Distortion can be calculated on the basis of a tilt component of the wavefront to be measured, as well as the coordinates of the TS lens focus and the RS mirror curvature center. The error quantity (DXi, DYi) between the idealistic imaging position and the actual imaging position with respect to the X and Y directions, namely, distortion, is given by the following equations:

$$DXi=TSXi-\beta RSXi+\Delta TSXi$$

$$DYi=TSYi-\beta RSYi+\Delta TSYi$$

where TSXi and TSYi are measured values of X and Y coordinates of the TS lens rear focal point at the i-th measurement position, RSXi and RSYi are measured values of X and Y coordinates of the RS mirror curvature center at the i-th measurement position, and ΔTSXi and ΔTSYi are correction amounts for the position coordinates of the TS lens 10 as obtainable from the tilt components in X and Y directions of the measured wavefront, which can be given by the following equations:

$$\Delta TSXi = -TiltXi\lambda/NA/2$$

$$\Delta TSYi = -TiltYi\lambda/NA/2$$

where TiltXi and TiltYi are tilt components in X and Y directions obtainable from the measured wavefront, λ is the wavelength, NA is the image-plane side numerical aperture of the lens 5 to be inspected, and β is an idealistic magnification. Also, the symbol "i" denotes the number which represents the position of the measurement point.

Similarly, the image plane position DZ (x, y) of the measurement point i having coordinates (x, y) is determined by the defocus component of the measured wavefront as well as the Z coordinates of the TS lens focal point and the RS mirror curvature center, and it can be given by the following equation:

$$DZ(x, y) = TSZ(x, y) - TSZ(0,0) + \beta\{(RSZ(x, 2) - (RSZ(0, 0)\} + DZO(x, y) - DZO(0,0)$$

wherein DZ0 (0, 0) is the defocus component obtained from the transmission wavefront at an origin (0, 0), which is the image point on the optical axis, TSZ (x, y) and RSZ (x, y) are measured values of Z coordinates of the TS lens focal point and RS mirror curvature center at the point (x, y), respectively, and TSZ (0, 0) and RSZ (0, 0) are measured values of Z coordinates of the TS lens focal point and RS mirror curvature center at the origin (0, 0), respectively.

The measurement at the first measurement point is completed with the above-described procedure, and subsequently, the TS lens 10 and the RS mirror 9 are moved toward a next measurement position, if any, and a similar measurement process is performed. This procedure is repeated for all the measurement points.

Although FIG. 7 shows a structure which is telecentric on the image side, the lens 5 may be an imaging lens being telecentric both on the object side and the image side. Further, the measurement can be done even to an imaging lens not being telecentric, provided that the TS lens is disposed so that the TS lens chief ray and the chief ray of the lens to be inspected are registered with each other. This can be accomplished by tilting the TS lens, for example.

In the first measuring method described above, since it needs a printing process and a development process, the measurement precision may be deteriorated by a factor attributable to the process, namely, wafer flatness, for example. Even after the development process, it needs several processes such as a measurement process using a microscope. Additionally, the procedure in each process is complicated. As a result, it requires cumbersome works and much time to obtain a single distortion measured value. More fundamentally, there is a possibility of accumulation of errors of measured values, being accumulated with the progress of processes. Further, in relation to the measurement of curvature of field, the curvature of field must be detected on the basis of the results of printing performed under different defocus conditions. This requires much time, and it involves deterioration of the measurement precision.

In the second measuring method using an interferometer, on the other hand, measurement of distortion at a measurement image point as well as measurement of the focal plane are repeated with respect to different points, and a distortion distribution and the curvature of field are calculated from the measurement results. This requires a long time for completion of the measurements to the whole view angle of the lens to be inspected. The TS lens or RS mirror mounted stage may be influenced by a change in environment or the like, and a drift may be produced in the measured value of the distortion or focal plane at each measurement image points. Further, due to the increasing precision of the lens to be inspected, measurement of temperature or pressure, for example, necessary for the environment correction becomes difficult.

SUMMARY OF THE INVENTION

It is accordingly an object of the present invention to enable high precision measurement of distortion and curvature of field of an imaging optical system such as a lens, for example, which is free from at least one of the inconveniences described hereinbefore.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
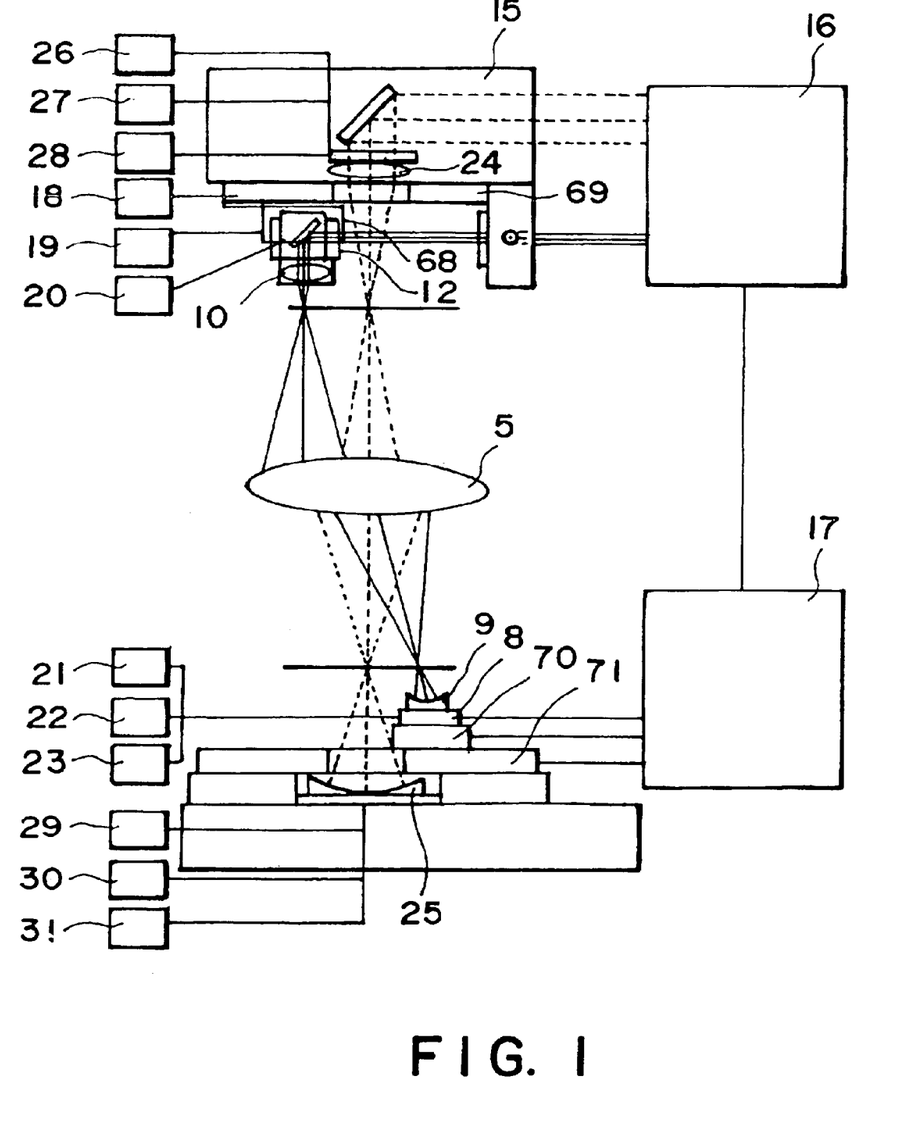
FIG. 1 is a schematic view of a first embodiment of the present invention.

FIG. 1 shows a first embodiment of the present invention.

In FIG. 1, the interferometer comprises a major assembly 16 and two sets of RS mirrors 9 and 25 and TS lenses 10 and 24 to be used for an image point on an optical axis (which is a standard image point for providing a reference value for drift correction) and for another measurement point, respectively. The structure of FIG. 1 is what is called a Fizeau type interferometer, and the final surface of the TS lens (Transmission Sphere lens) is used as a reference surface. It is to be noted here that, while the standard image point can be set at any desired position if predetermined, from the standpoint of balance to all the measurement points, preferably an image point on the optical axis may be chosen therefor.

Hereinafter, the TS lens 24 and the RS mirror 25 for the image point on the optical axis will be referred to as a drift value referring TS lens 24 and a drift value referring RS mirror, respectively. The TS lens 10 and the RS mirror 9 for the other measurement point will be referred to simply as a TS lens 10 and an RS mirror 9.

Parallel light emitted from the major assembly 16 of the interferometer is reflected by a fixed mirror, mounted on a base table 15, in a direction of the depth of the sheet of the drawing (i.e., forwardly in the drawing). The reflected light is then reflected by a mirror which is disposed on a TS lens driving Y stage 14 and another mirror which is mounted on a TS lens driving X stage 13. The reflected light is then incident on the TS lens 10 which is mounted on a TS lens driving Z stage 12. The light passing through the TS lens 10 is converged at a position which is upon the rear focal plane of the TS lens 10 and which is substantially coincident with the object plane of the lens 5. The thus converged light passes the lens 5 to be inspected and, thereafter, it is collected again upon the image plane of the lens 5. At the image plane side, the RS mirror (Reflectance Sphere mirror) 9 is disposed so that the curvature center thereof coincides approximately with the point of convergence of the light upon the image plane of the lens 5. Thus, the light as reflected by the RS mirror 9 goes backwardly along its oncoming path, and it enters the interferometer major assembly 16 as a detection wave.

On the other hand, a portion of the light incident on the TS lens 10 is reflected by the reference surface of the TS lens 10, and it goes backwardly along its oncoming path, such that it enters the interferometer major assembly 16 as a reference wave.

The drift value referring interferometer has a similar structure. Light passing through the drift value referring TS lens 24 is converged at a rear focal plane of the lens 24. The position of the convergence point approximately coincides with the object plane of the lens 5 to be examined. The collected light passes the lens 5 and, thereafter, it is collected again at the image plane side. At the image plane side, the drift value referring RS mirror 25 is disposed so that its curvature center approximately coincides with the light convergence point upon the image plane of the lens to be examined, The light reflected by the RS mirror goes backwardly along its oncoming path, and it enters the interferometer major assembly 16 as a drift value referring detection wave.

On the other hand, a portion of the light entering the drift value referring TS lens 24, fixedly mounted on the base table 15, is reflected by the reference surface of the lens 24, and it goes backwardly along its oncoming path and enters the interferometer major assembly as a drift value referring reference wave.

In this embodiment, the drift value referring RS mirror 25 and the other RS mirror 9 for the remaining measurement point have different curvature radii and, also, the distance between the final surface of the drift value referring TS lens 25 and the rear focal point thereof differs from the distance between the final surface of the TS lens 10 for the remaining measurement point and the rear focal point thereof. However, these sizes may be made equal to each other. Further, the TS lens 24 and the RS mirror 25 may not be fixed but they may be provided on a movable stage.

In this embodiment, as regards the standard image point, the measurement is performed only by use of the drift value referring optical system.

Figure 2:
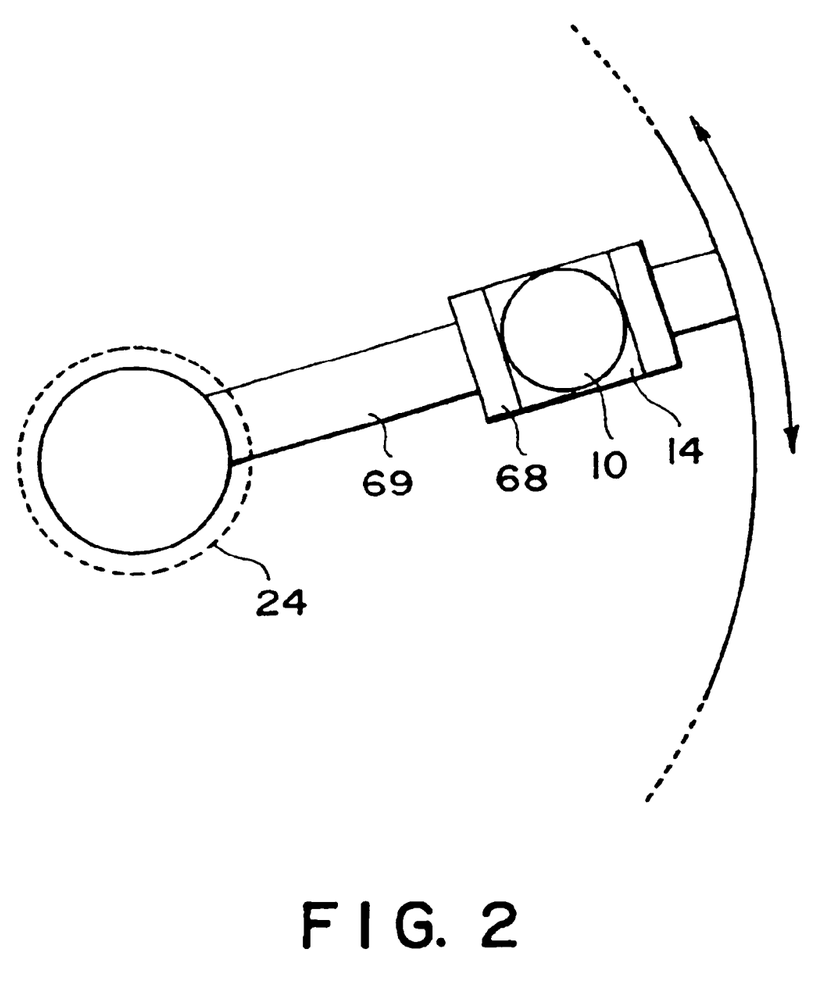
FIG. 2 is a schematic view of an interference measuring unit in a second embodiment of the present invention.

The TS lens driving stages 12, 68 and 69 as well as the RS mirror driving stages 8, 70 and 71 should be structured so as to avoid disturbance to the light which passes the drift value referring optical system. In this embodiment, as shown in FIG. 2, the TS lens is provided as an rθZ stage about the optical axis of the drift value referring optical system, and there are a central portion of a θ stage 69 and an opening. This facilitates the mechanical design for avoiding the disturbance or interference.

The RS mirror 9 and the drift value referring RS mirror 25 can be scanningly moved in the optical axis direction by means of a piezoelectric device, for example. At each scan position, an interference fringe due to the drift value referring reference wave and the drift value referring detection wave (hereinafter, first interference fringe), as well as an interference fringe due to the reference wave and the detection wave (hereinafter, second interference fringe) are measured by a camera inside the interferometer major assembly, as the intensity data. The measurement result is transmitted to a host computer, and transmission wavefronts (hereinafter, first transmission wavefront and second transmission wavefront) are calculated as phase data of the first and second interference fringes. The interference fringe measurement uses a fringe scan method, such that high precision phase measurement is enabled. The camera inside the interferometer major assembly, for detecting the interference fringe intensity may be provided in two independent channels for the first and second interference fringes, separately, or it may be provided in a single channel structure wherein both of the first and second interference fringes are detected by one and the same camera.

The distance measuring units 18–23 and 26–31 are operable to measure the position coordinates (TSXi, TSYi, TSZi) adjacent the rear focal point of the TS lens 10 in the transmission wavefront measurement, the position coordinates (RSXi, RSYi, RSZi) adjacent the curvature center of the RS mirror 9, the position coordinates (TSX0i, TSY0i, TSZ0i) adjacent the rear focal point of the drift value referring TS lens 24, and the position coordinates (RSX0i, RSY0i, RSZ0i) adjacent the curvature center of the drift value referring RS mirror 25.

In the position coordinates measurement, a mirror is disposed at a position close to both points, and this mirror position is measured by using an interference distance gauge, for example. When the measurement is carried out by using a mirror placed away from both points, the posture of the TS lens and RS mirror (i.e., pitching, yawing and rolling) may be measured so that the distance between the measurement point and the idealistic measurement point can be corrected.

In this embodiment, the measuring units 18–23 use interference distance gauges, and the drift value referring optical system and the optical system for the other measurement point are measured separately. From the difference in measured distance in this structure, the optical system for the measurement point can always be represented by a relative value with respect to the drift value referring optical system, such that the influence of the drift of the movable stage in the optical system for the measurement point can be reduced. Thus, the measurement with the drift value referring optical system for measuring the reference image point is performed frequently, in other words, it is done many times more than the measurement for the measurement point.

Next, measurement of distortion and curvature of field in the present invention will be described in greater detail.

The drift value referring TS lens 24 and RS mirror 25 are fixed at an image point on the optical axis and an object point on the optical axis, that is, a standard point. In this state, the RS mirror 9 and the RS lens 10 are moved toward the i-th measurement point. The motion is performed while aiming at the coordinates in which a conjugate relation is substantially satisfied between the rear focal point of the TS lens and the curvature center of the RS mirror. The coordinates being aimed at are set as relative coordinates with respect to the RS mirror 25 and TS lens 24, being disposed at the origin.

Subsequently, measurement of the transmission wavefront is performed at the i-th measurement point.

Simultaneously, the position coordinates of the TS lens rear focal point, RS mirror curvature center, the drift value referring TRS lens near focal point, and the drift value referring RS mirror curvature center are determined. Here, the transmission wavefront, which is obtainable from a standard point for referring to the drift value, is called a first transmission wavefront, and the transmission wavefront, which is obtainable from the i-th measurement point, is called a second transmission wavefront.

Then, the tilt component and the defocus component of the measured transmission wavefronts are calculated. These components can be detected by fitting the transmission wavefront data in accordance with Zernike polynomial, using a least square method, for example. The calculation is done with respect to each of the first and second transmission wavefronts.

From the tilt components of the measured first and second transmission wavefronts, the measured coordinates (TSXi, TSYi) of the TS lens 10, the measured coordinates (RSXi, RSYi) of the RS mirror 9, the measured coordinates (TSX0i, TSY0i) of the drift value referring TS lens 24, and the measured coordinates (RSX0i, RSY0i) of the drift value referring RS mirror 25, and in accordance with equations below, error quantities (DXi, DYi) between the idealistic imaging position and the actual imaging position with respect to the X and Y directions, namely, the distortion, can be calculated.

$$DXi = \{TSXi-(TSX0i-TSX01)\}-\beta\{RSXi-(RSX0i-RSX01)\}+\Delta TSXi$$

$$DYi = \{TSYi-(TSY0i-TSY01)\}-\beta\{RSYi-(RSY0i-RSY01)\}+\Delta TSYi$$

where TSX01 and TSY01 as well as RSX01 and RSY01 are measured coordinates of the drift value referring TS lens and RS mirror in the first measurement, $\Delta TSXi$ and $\Delta TSYi$ are correction amounts for the position coordinates of the TS lens as obtainable from the tilt components in X and Y directions of the measured wavefront, which are given by the following equations:

$$\Delta TSXi = -\{TiltXi-(TiltX0i-TiltX01)\}\lambda/NA/2$$

$$\Delta TSYi = -\{TiltYi-(TiltY0i-TiltY01)\}\lambda/NA/2$$

wherein TiltX0i, TiltY0i, TiltXi and TiltYi are tilt components in X and Y directions at the standard image point and the measurement image point as obtainable from the first and second wavefronts in the i-th measurement, TiltX01 and TiltY01 are tilt components in X and Y directions of the reference image point (the position of the drift value referring TS lens 24 and RS mirror 25) in the first measurement, $\lambda$ is the wavelength, NA is the image-plane side numerical aperture of the lens 5 to be inspected, $\beta$ is an idealistic magnification, and i is the number which represents the position of the measurement point.

The image plane position DZ(Xi, Yi) of the i-th measurement point can be expressed by the following equation, in terms of the defocus components of the first and second transmission wavefronts, and the coordinates of the TS lens focal point and the curvature center of the RS mirror, as follows.

$$DZ(Xi, Yi) = TSZ(Xi, Yi) - TSZ(X0i, Y0i) + \beta\{RSZ(Xi, Yi) - RSZ(X0i, Y0i)\} + DZ0(Xi, Yi) - DZ0(X0i, Y0i)$$

wherein DZ0 (X0i, Y0i) and DZ0 (Xi, Yi) are defocus components obtainable from the first and second transmission wavefronts, TSZ(Xi, Yi) and RSZ(Xi, Yi) are measured values of the TS lens focal point and RS mirror curvature center, TSZ(X0i) and RSZ(X0i, Y0i) are measured values of the position coordinates of the drift value referring TS lens rear focal point and the drift value referring RS mirror curvature center. The defocus component from the measurement wave can be calculated by computing the contrast value while applying a spherical component, corresponding to the defocus component, to the measurement wavefront. The defocus position with a best contrast value are taken as the image point at the point (Xi, Yi), for example.

The measurement with regard to the i-th measurement point is completed as above. If there is a subsequent measurement point, the TS lens 10 and the RS mirror 9 are moved toward the next measurement position, and the procedure from the measurement of the transmission wavefront is repeated again.

After the measurement at the last measurement point is completed, the error quantity (DXi, DYi) between the idealistic imaging point and the actual imaging point at each measurement points and the focal plane DZ(Xi, Yi) are synthesized, such that a distortion distribution and curvature of field within the view angle of the lens to be examined are obtained while even taking into account the transmission wavefront.

In this embodiment, an interference distance gauge is used to suppress the drift of a movable stage, and the effect of drift due to any other factor is corrected by continuously monitoring the axial wavefront, Thus, high precision measurement of distortion and curvature of field is enabled.

A second embodiment of the present invention is arranged so that any change with respect to time of distortion and curvature of field can be observed without an observation system for a reference image point as used in the first embodiment, and the structure is similar to the second measuring method.

In order to determine the curvature of field and the distortion distribution inside the view angle of a lens to be inspected, it is necessary to measure the distortion and focal plane at different image points within the view angle. In this embodiment, during measurement with respect to the different image points, measurement of an axial image point corresponding to a standard image point is performed many times. From the quantity of changes in distortion and focal plane at the standard image point, a variation component with respect to time at the other measurement points is calculated, and correction is performed accordingly.

If it is assumed that, with regard to the i-th measurement point (Xi, Yi), the measurement of a standard point just before it is performed in relation to the (i−a)th measurement point and the measurement of a standard point just after it is performed at the (i+b)th measurement point, distortion after correction of the i-th variation quantity with respect to time can be determined by the following equations:

$$DXdc(Xi, Yi) = DX(Xi, Yi) - \{DX0(i+b) - DX0(i-a)\}a/(a+b) - \{DX0(i-b) - X0(1)\}$$

$$DYdc(Xi, Yi) = DY(Xi, Yi) - \{DY0(i+b) - DY0(i-a)\}a/(a+b) - \{DY0(i-b) - X0(1)\}$$

The correction formulae mentioned above are determined while taking the variation quantities with respect to time of each measurement image point as a linear complement to the variation quantity with respect to time of the standard image point. Here, DXdc (Xi, Yi) and DYdc (Xi, Yi) are distortion at the i-th measurement point after correction of the variation with respect to time, DX (Xi, Yi) and DY (Xi, Yi) are measured values of distortion at the i-th measurement point, and DX0 and DY0 are distortion at the standard image point. Each argument shows the correspondence of the measurement at the standard image point to the number of measurement points. Also, the argument "1" shows that the first measurement is to the standard image point.

As regards the detection of the focal plane, similar correction is possible. More specifically:

$$DZ(Xi, Yi) = TSZ(Xi, Yi) - (TSZ0(i+b) - TSZ0(i-a))a/(a+b) -$$
$$TSZ0(i-a) + \beta(RSZ(Xi, Yi) - (RSZ0(i+b) -$$
$$(RSZ0(i-a))a/(a+b) - RSZ0(i-a)) + DZ0(Xi, Yi) -$$
$$(DZ0(i+b)) - DZ0(i-a))a/(a+b) - DZ0(i-a)$$

where $DZ(Xi, Yi)$ is the defocus component at the i-th measurement point after correction of the variation with respect to time, $TSZ(Xi, Yi)$ and $RSZ(Xi, Yi)$ are measured values of coordinates of the TS lens focus and RS mirror curvature center position at the i-th measurement point, $TSZ0$ and $RSZ0$ are measured values of the TS lens focus and RS mirror curvature center position at the standard image point. Each argument shows the correspondence of the measurement at the standard point with the number of measurement point. $DZ0(Xi, Yi)$ denotes the defocus component obtained from the transmission wavefront. The argument "1" shows that the first measurement is to the standard image point, and $\beta$ denotes the idealistic imaging magnification of the lens being examined.

In this embodiment, as regards the method of complementing the variation amount at each measurement image point with respect to time, straight complement based on the amount of changes, with time, between two standard-image-point measurements before and after the measurement image point. However, the number of standard image points to be used for the complementation may be other than two. Also, a curved complementation may be used.

Where the above-described correction is carried out to the whole measurement points, any change in distortion or curvature of field with respect to time can be corrected and reduced even by use of a single set of TS lens and RS mirror. Therefore, a lens performance measuring system capable of doing high precision measurement is accomplished.

Figure 3:
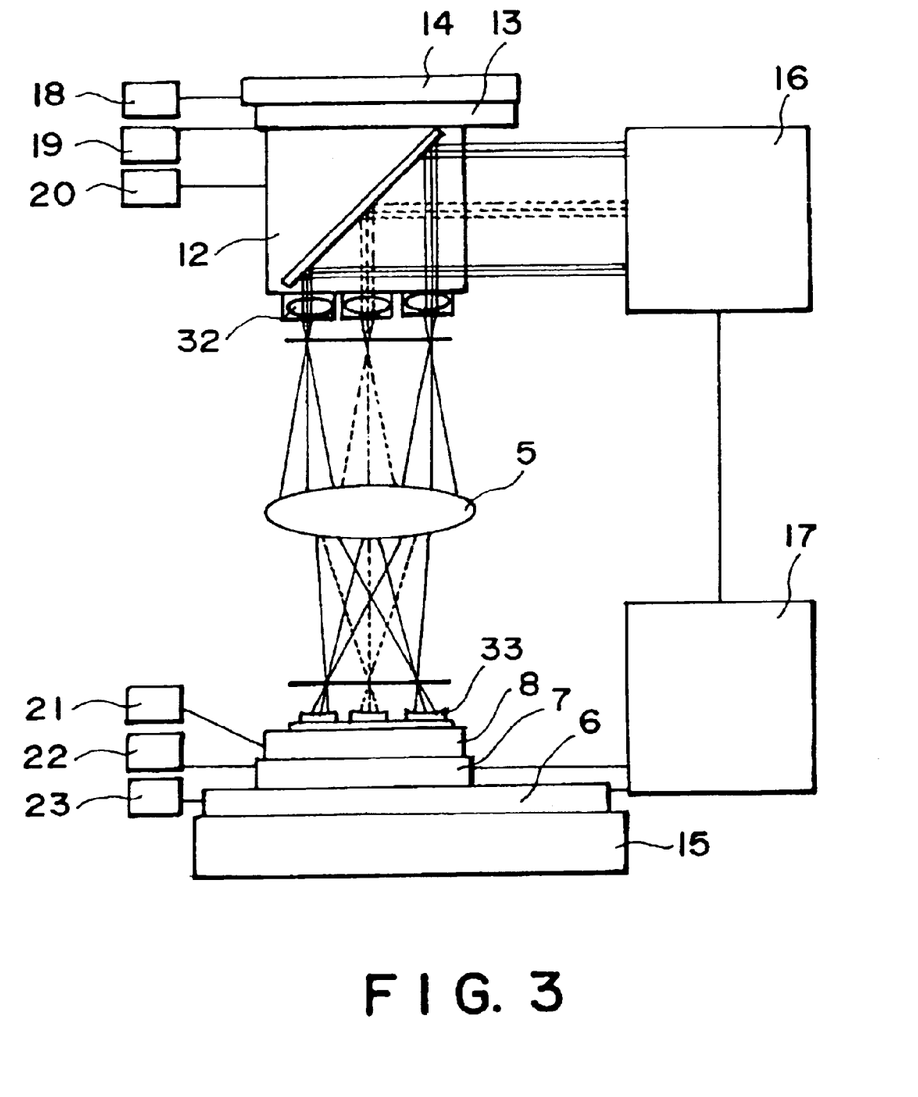
FIG. 3 is a schematic view of a third embodiment of the present invention.

FIG. 3 shows the structure of a third embodiment according to the present invention. While the first embodiment uses two sets of TS lenses and RS mirrors, this embodiment uses plural sets of TS lenses and RS mirrors, to enable simultaneous measurement at plural measurement points in addition to the standard image point. Because of the increase in a number of TS lenses and RS mirrors, independent motion of each TS lens and RS mirror is not adopted in this embodiment.

The curvature centers of each spherical mirror of the RS mirror group 33 are disposed to satisfy the conjugate relation with the near focal points of corresponding lenses of the TS lens group 32. Namely, when the position coordinates of the rear focal point of the i-th TS lens are expressed as ($TSXi$, $TSYi$) while taking the optical axis as an origin, the position ($RSXi$, $RSYi$) of the curvature center of the i-th RS mirror is given by the following equations:

$$RSXi = TSXi/\beta$$
$$RSYi = TSYi/\beta$$

where $\beta$ is the idealistic imaging magnification of the lens 5 being inspected.

In this embodiment, the rear focus position of each TS lens as well as the curvature center position of each RS mirror, after being manufactured, are measured beforehand.

As regards the measurement of the focus position of each TS lens, an RS mirror disposed on a movable stage may be used and, without using the lens to be examined, a Fizeau type interferometer may be constructed directly to each TS lens. From the position coordinates of the RS mirror and the tilt component of the measurement wavefront, the rear focus position can be measured. As regards the RS mirror group, similarly, a TS lens may be mounted on a movable stage, and the curvature center position can be measured.

The manner of calculating distortion and focal plane at each measurement points, during and after the measurement, is the same as in the first embodiment. However, since plural measurement points can be measured simultaneously in this embodiment, the influence of stage drift or any change in environment is reduced. Therefore, the measurement time can be shortened considerably.

Figure 4:
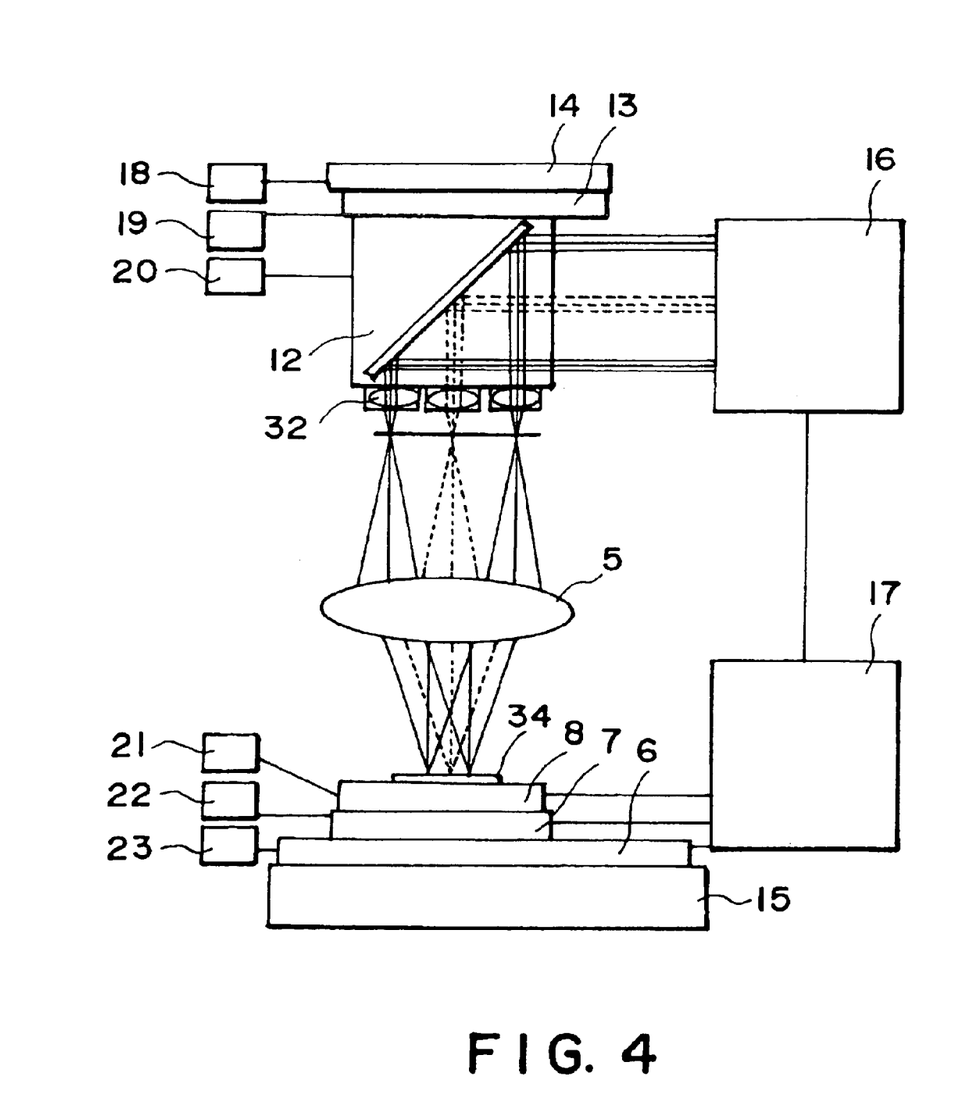
FIG. 4 is a schematic view of a fourth embodiment of the present invention.

FIG. 4 shows the structure of a fourth embodiment according to the present invention. In this embodiment, the RS mirror group of the second embodiment is replaced by a plane mirror 34.

The plane mirror 34 is disposed upon the image plane of the lens 5 to be examined. For the measurement, the lens should be telecentric on one side or both sides. If it is telecentric on one side thereof, the chief ray of the TS lens and the chief ray of the lens to be examined should be registered with each other. Thus, the TS lens may be tilted, for example, to this end.

Although the structure is simplified by replacing the RS mirror by a flat mirror, only the revolutionally symmetrical component of the transmission wavefront of the lens to be examined can be calculated with this structure. Therefore, distortion can not be measured in this embodiment. However, simultaneous measurement of the focal plane with respect to different measurement points can be done without difficulties involved in the manufacture of the RS mirror group. This is an advantage in this embodiment. The calculation of the focal plane is similar to that of the second measuring method described hereinbefore.

Figure 5:
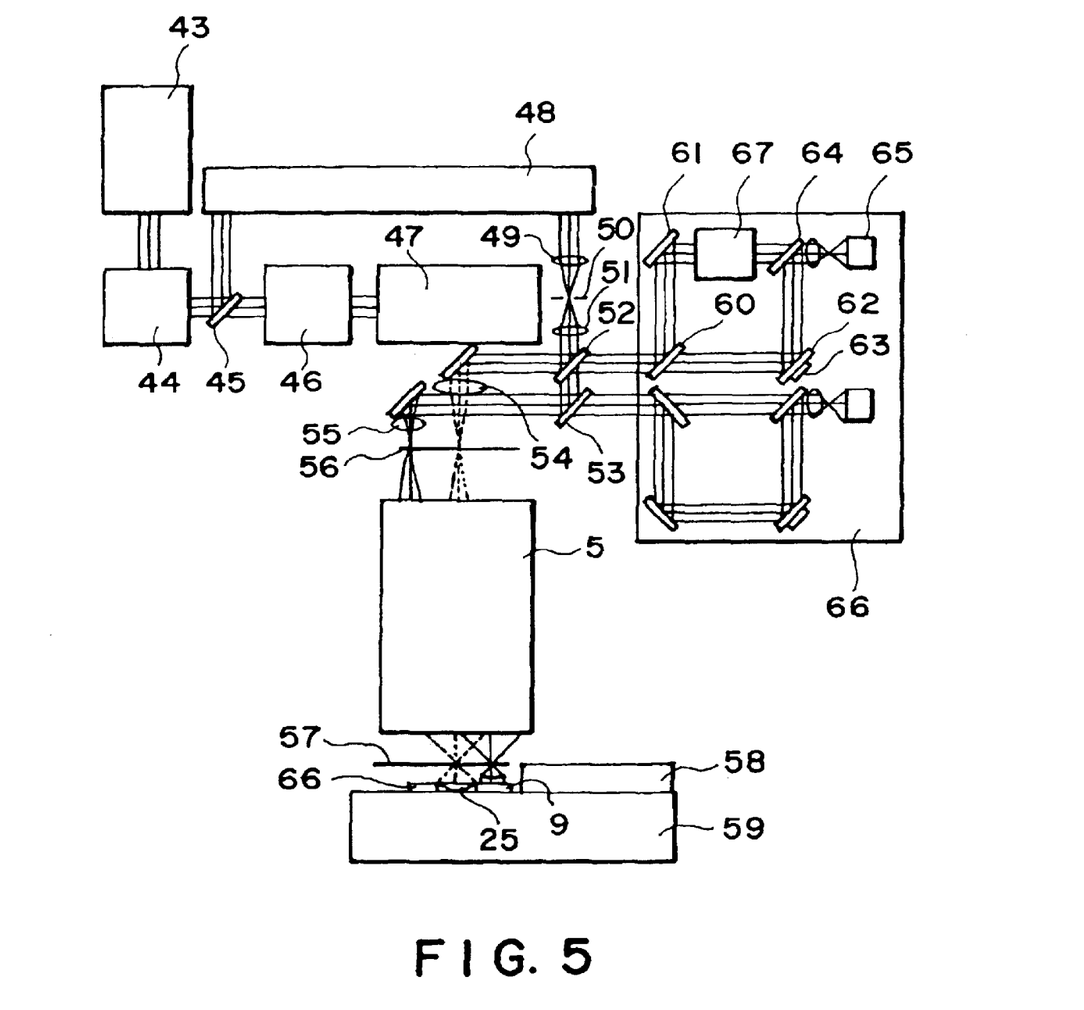
FIG. 5 is a schematic view of a fifth embodiment of the present invention.

FIG. 5 shows a fifth embodiment of the present invention. In this embodiment, the lens performance measuring system of the present invention is incorporated into a projection exposure apparatus having a projection optical system which is the lens to be examined. This embodiment enables high precision measurement of distortion and curvature of field of a projection optical system within the major assembly of the projection exposure apparatus.

In FIG. 5, the light emitted from an exposure light source 43 such as an excimer laser is transformed by a beam shaping optical system 44 into a beam shape symmetrical with respect to the optical axis, and then it is directed to a light path interchanging mirror 45. The mirror 45 is retracted out of the light path during the normal exposure process, so that the light is directed toward an illumination optical system 47. More specifically, the light emitted from the beam shaping optical system 44 enters an incoherency-transforming unit 46 by which the coherency of the light is reduced. After this, the light passes the illumination optical system 47, and it illuminates the surface of a reticle 56. The light passing through the reticle enters a projection optical system 5 which is the lens to be examined, and so that a pattern formed on the reticle 56 surface is projected onto the surface of a wafer 57.

There is a wafer chuck 58 disposed inside the view angle of the projection optical system 5.

The structure of an interferometer as being guided by the light path interchanging mirror 45 will be described below.

For measurement of the lens performance, the light emitted from the beam shaping optical system 44 is reflected by the light path interchanging mirror 45 inserted into the light path, and it through a directing optical system 48 and enters a condensing lens 49. Adjacent the focal point of the condensing lens 49, there is a pinhole 50. The light passing through the pinhole 50 is transformed again into parallel light by means of a collimator lens 51. The diameter of the pinhole 50 may be set to be approximately equal to the diffraction limit determined by the numerical aperture of the condensing lens 49, to regulate the transverse mode of light. The parallel light emitted from the collimator lens 51 is divided by a half mirror 52 into two. In this embodiment, the light reflected by the half mirror is directed to a drift value referring optical system, while the light passing through the mirror is directed to an optical system for the other measurement points.

In the measurement, the wafer chuck 58 moves out of the view angle of the projection optical system and, in place of it, an RS mirror 9 and a drift value referring RS mirror 25 are inserted into the view angle.

In the drift value referring optical system, the light reflected by the half mirror 52 is directed to a collimator lens 54. The rear focal point of the collimator lens 54 is disposed to be approximately registered with the reticle surface 56. As a result, the light collected by the collimator lens 54 is collected again by the projection optical system 5, at a position close to the wafer surface 57. The drift value referring RS mirror 25 is fixedly mounted on a wafer stage 59 so that the curvature center position thereof is disposed to be approximately coincident with a conjugate point of the focal point position of the collimator lens with respect to the projection optical system 5. The light reflected by the RS mirror 25 goes backwardly along its oncoming path, and it is incident again on the half mirror 52.

The light passing through the drift value referring optical system (collimator lens 54, RS mirror 25 and the like) and impinging on the half mirror 52 then passes therethrough, and the light is incident on a half mirror 60 inside the interferometer major assembly 66.

On the other hand, in the optical system for the measurement points, the light passed through the half mirror 52 is reflected by a half mirror 53, and it is directed to a collimator lens 55. The collimator lens 55 is mounted on an X-Y-Z movable stage, and the light convergence point thereof is inside the view angle of the projection optical system 5. It enables motion to any object point adjacent to the reticle surface 56. The manner of directing light to the collimator lens 55 may be the same as in the first embodiment. The rear focal point of the collimator lens 55 is approximately registered with the reticle surface 6 of the projection optical system 5, and the curvature center of the RS mirror 9 is disposed to be approximately coincident with a conjugate point of the focal point position of the collimator lens 55 with respect to the projection optical system 5. As a consequence, the light collected by the collimator lens 55 is collected again on the wafer surface 57 by means of the projection optical system 5. The light is then reflected by the RS mirror 9 which is disposed on an X-Y-Z movable stage 66, fixedly mounted on the wafer stage 59. The reflected light goes backwardly along its oncoming path, toward the half mirror 53.

The inside structure of the interferometer major assembly 66 will now be described.

The light incident on the half mirror 60 is divided thereby into two. The light reflected by the half mirror 60 (hereinafter, "light A") is reflected by a flat mirror 61, and the beam diameter thereof is expanded by a beam expander 67. After this, the light passes through a half mirror 64. On the other hand, the light transmitted through the half mirror 60 (hereinafter, "light B") is reflected by a flat mirror 62 which is mounted on a movable stage 63, being moved by a piezoelectric device, for example, and the light is projected on the half mirror 64. The light B is reflected by the half mirror 64, and goes substantially along the same path as the light A. The optical path difference between the light A and the light B, from being divided by the half mirror 60 to being substantially combined into the same path by the half mirror 64, is registered within the range of the coherence length of the exposure light source 43. What can be observed by a CCD camera 65 is an interference fringe produced by the light A and the light B being laterally shifted with respect to the light A.

The observed interference fringe is a differentiated value to the lights A and B, in the same radial direction about the optical axis, having wavefront aberrations corresponding to the sum of the projection optical system 5 and the intermediate optical systems. By integrating it and subtracting therefrom the wavefront aberration and shape errors of the intermediate optical systems, the wavefront aberration of the projection optical system 5 can be determined. The wavefront calculation may be based on a fringe scan method in which the movable stage 63 is moved by an amount corresponding to the wavelength. As regards the wavefront aberration and shape errors of the intermediate optical systems, they may be measured beforehand by using a separate interferometer or, alternatively, it may be measured by using a system error measuring method. In such system error measuring method, an RS mirror 25 may be disposed below the collimator lens 54, and the wavefront aberration is measured in three conditions of zero deg., 180 deg., and apex reflection. From the results, the wavefront aberration of the intermediate optical systems can be detected.

As regards the wavefront passing through the optical system for the measurement points (i.e., collimator lens 55, RS mirror 9 and the like), it can be measured by using a similar interferometer.

Simultaneously with the wavefront measurement at the standard image point, referring to the drift value, and at the remaining measurement points, the position coordinates of the rear focal points of the collimator lenses 34 and 55 and the curvature centers of the RS mirrors 9 and 25 can be measured, in a similar way as in the first embodiment.

The manner of measuring distortion and curvature of field on the basis of the wavefront data and position coordinates described above, is essentially the same as in the first embodiment.

The measuring system for measuring the performance of an imaging optical system as has been described above enables correction of the influence of a change with respect to time, such as drift, for example, which adversely affects the measurement. Additionally, the measurement does not need complicated and numerous processes such as exposure and development, in the lens evaluation. Moreover, it can be done without being influenced by a drift of a movable stage or an environmental variation. As a result, the performance of a lens can be measured automatically, easily and precisely.

While the invention has been described with reference to the structures disclosed herein, it is not confined to the details set forth and this application is intended to cover such modifications or changes as may come within the purposes of the improvements or the scope of the following claims.

What is claimed is:

1. A measuring system for measuring performance of an imaging optical system, said measuring system comprising:
   an interferometer for measuring transmission wavefronts, in relation to plural measurement points defined along a plane perpendicular to an optical axis of the imaging optical system; and
   a computing unit for calculating an imaging state of the imaging optical system on the basis of information regarding the transmission wavefronts measured by said interferometer and the position coordinates of the plural measurement points, and said computing unit calculating said imaging state at each measurement point, while taking, as a reference, an imaging state at a standard point set along a plane perpendicular to the optical axis.

2. A measuring system according to claim 1, wherein the measurement of a transmission wavefront and a position coordinate with respect to the standard point is performed plural times more than the measurement of the transmission wavefront and the position coordinate with respect to another measurement point.

3. A measuring system according to claim 2, wherein the measurement of the transmission wavefront and the position coordinate with respect to the standard point is performed simultaneously and every time the measurement of the transmission wavefront and the position coordinate with respect to another measurement point is performed.

4. A measuring system according to claim 1, wherein the standard point is an object point and an image point on the optical axis of the imaging optical system.

5. A measuring system according to claim 1, wherein the position coordinates of the measurement point concern a relative coordinate system with respect to the position coordinates of the standard point.

6. A measuring system according to claim 1, wherein the optical system for measurement of the standard point is provided separately from an optical system for measurement of the other measurement point.

7. A measuring system according to claim 6, wherein the optical system for measurement of the other measurement point is movable at the object plane side and the image plane side and the optical system has a laser interferometer for monitoring the position coordinates thereof.

8. A measuring system according to claim 6, further comprising optical systems for measurement of the other measuring points, the number of which corresponds to the number of the measurement points.

9. A measuring system according to claim 1, wherein the measurement with respect to the standard point and the other measurement points is carried out by use of one and the same optical system.

10. A measuring system according to claim 9, wherein the same optical system for measurement of the standard point and the measurement point is movable at the object plane side and the image plane side, and further comprising a laser interferometer for monitoring the moved position coordinates.

11. A measuring system according to claim 1, wherein, in an optical system for the other measurement point, a chief ray of light impinging on the measurement points is registered with a direction of a chief ray of the imaging optical system.

12. A measuring system according to claim 1, wherein the imaging state includes distortion and curvature of field.

13. A projection exposure apparatus for performing projection exposure by use of an imaging optical system, said apparatus comprising:
   an imaging optical system;
   an interferometer for measuring transmission wavefronts in relation to at least one of plural measurement points defined along a plane perpendicular to an optical axis of the imaging optical system; and
   a computing unit for calculating an imaging state of the imaging optical system on the basis of information regarding the transmission wavefronts measured by said interferometer and the position coordinates of the plural measurement points and said computing unit calculating said imaging state at each measurement point, while taking, as a reference, an imaging state at a standard point set along a plane perpendicular to the optical axis.

14. A measuring system for measuring performance of an imaging optical system, said measuring system comprising:
   an interferometer for measuring transmission wavefronts in relation to at least one of plural measurement points defined along a plane perpendicular to an optical axis of the imaging optical system; and
   a computing unit for calculating at least one of distortion and curvature of field of the imaging optical system on the basis of information regarding the transmission wavefronts measured by said interferometer and the position coordinates of plural measurement points and said computing unit calculating at least one of the distortion and curvature of field at each measurement point, while taking, as a reference, at least one of distortion and curvature of field at a standard point set along a plane perpendicular to the optical axis.

15. A measuring system according to claim 14, wherein a result of the measurement of distortion and curvature of field with respect to the other measurement point is complemented on the basis of a result of measurements made plural times to the distortion and the curvature of field with respect to the standard point.

16. A measuring system according to claim 14, wherein the standard point is an object point and an image point on the optical axis of the imaging optical system.

17. A measuring system according to claim 14, wherein the position coordinates of the measurement point concern a relative coordinate system with respect to the position coordinates of the standard point.

18. A measuring system according to claim 14, wherein correction of a change of distortion and curvature of field with respect to time is carried out by subtracting the amount of change from the measured values of them.

19. A measuring system according to claim 14, wherein an optical system for measurement of the standard point is provided separately from an optical system for measurement of the other measurement point.

20. A measuring system according to claim 19, wherein the optical system for measurement of the other measurement point is movable at the object plane side and the image plane side and the optical system has a laser interferometer for monitoring the position coordinates thereof.

21. A measuring system according to claim 19, further comprising optical systems for the other measurement points, of a number the same as the measurement points.

22. A measuring system according to claim 14, wherein the measurement with respect to the standard point and the other measurement points is carried out by use of one and the same optical system.

23. A measuring system according to claim 22, wherein the same optical system for measurement of the standard point and the measurement point is movable at the object plane side and the image plane side, and further comprising a laser interferometer for monitoring the moved position coordinates.

24. A measuring system according to claim 14, wherein, in an optical system for the other measurement point, a chief ray of light impinging on the measurement points is registered with a direction of a chief ray of the imaging optical system.

25. A projection exposure apparatus for performing projection exposure by use of an imaging optical system, said apparatus comprising:

an imaging optical system;
an interferometer for measuring transmission wavefronts in relation to at least one of plural measurement points defined along a plane perpendicular to an optical axis of the imaging optical system; and
a computing unit for calculating at least one of distortion and curvature of field of the imaging optical system on the basis of information regarding the transmission wavefronts measured by said interferometer and the position coordinates of the plural measurement points and said computing unit calculating at least one of the distortion and curvature of field at each measurement point, while taking, as a reference, at least one of distortion and curvature of field at a standard point set along a plane perpendicular to the optical axis.

26. A method of measuring performance of an imaging optical system, said method comprising the steps of:

measuring, by use of an interferometer, transmission wavefronts in relation to at least one of plural measurement points defined along a plane perpendicular to an optical axis of the imaging optical system;
calculating an imaging state of the imaging optical system on the basis of information regarding the transmission wavefronts measured in said measuring step and the positions coordinates of the plural measurement points; and
calculating said imaging state at each measurement point, while taking, as a reference, an imaging state at a standard point set along a plane perpendicular to the optical axis.

27. A method of measuring performance of an imaging optical system, said method comprising the steps of:

measuring, by use of an interferometer, transmission wavefronts in relation to at least one of plural measurement points defined along a plane perpendicular to an optical axis of the imaging optical system;
calculating at least one of distortion and curvature of field of the imaging optical system on the basis of information regarding the transmission wavefronts measured in said measuring step and the position coordinates of the plural measurement points; and
calculating at least one of the distortion and curvature of field at each measurement point, while taking, as a reference, at least one of distortion and curvature of field at a standard point set along a plane perpendicular to the optical axis.

28. A measuring system for measuring performance of an imaging optical system, said measuring system comprising:

an interferometer for measuring transmission wavefronts of the imaging optical system with respect to at least one of plural measurement points which are defined along a plane perpendicular to an optical axis of the imaging optical system; and
a computing unit for calculating an imaging state of the imaging optical system, on the basis of information regarding transmission wavefronts as measured by said interferometer, said computing unit calculating an imaging state with respect to a measurement point, while taking, as a reference, an imaging state at another measurement point being set along a plane perpendicular to the optical axis.

29. A measuring system for measuring performance of an imaging optical system, said measuring system comprising:

an interferometer for measuring transmission wavefronts, in relation to plural measurement points defined along a plane perpendicular to an optical axis of the imaging optical system; and
a computing unit for calculating wavefront aberration of the imaging optical system on the basis of information regarding the transmission wavefronts measured by said interferometer and position coordinates of the plural measurement points, said computing unit calculating the wavefront aberration at each measurement point while taking, as a reference, the wavefront aberration at a standard point set along a plane perpendicular to the optical axis.

30. A measuring system according to claim 29, wherein the measurement of a transmission wavefront and a position coordinate with respect to the standard point is performed a plurality of times more than the measurement of the transmission wavefront and the position coordinate with respect to another measurement point.

31. A measuring system according to claim 30, wherein the measurement of the transmission wavefront and the position coordinate with respect to the standard point is performed simultaneously and every time the measurement of the transmission wavefront and the position coordinate with respect to another measurement point is performed.

32. A measuring system according to claim 29, wherein the standard point is an object point and an image point on the optical axis of the imaging optical system.

33. A measuring system according to claim 29, wherein the position coordinates of the measurement point concern a relative coordinate system with respect to the position coordinates of the standard point.

34. A measuring system according to claim 29, wherein an optical system for measurement of the standard point is provided separately from an optical system for measurement of the other measurement point.

35. A measuring system according to claim 34, wherein the optical system for measurement of the other measurement point is movable at the object plane side and the image plane side, and the optical system has a laser interferometer for monitoring the position coordinates thereof.

36. A measuring system according to claim 34, further comprising optical systems for measurement of the other measuring points, the number of which corresponds to the number of measurement points.

37. A measuring system according to claim 29, wherein the measurement with respect to the standard point and the other measurement points is carried out by use of one and the same optical system.

38. A measuring system according to claim 37, wherein the same optical system for measurement of the standard point and the measurement point is movable at the object plane side and the image plane side, and further comprising a laser interferometer for monitoring the moved position coordinates.

39. A measuring system according to claim 29, wherein, in an optical system for the other measurement point, a chief ray of light impinging on the measurement points is registered with a direction of a chief ray of the imaging optical system.

40. A measuring system according to claim 29, wherein the imaging state includes distortion and curvature of field.

41. A projection exposure apparatus for performing projection exposure by use of an imaging optical system, said apparatus comprising:

an imaging optical system;

an interferometer for measuring transmission wavefronts in relation to at least one of plural measurement points defined along a plane perpendicular to an optical axis of the imaging optical system; and a computing unit for calculating wavefront aberration of the imaging optical system on the basis of information regarding the transmission wavefronts measured by said interferometer and the position coordinates of the plural measurement points, said computing unit calculating the wavefront aberration at each measurement point, while taking, as a reference, the wavefront aberration at a standard point set along a plane perpendicular to the optical axis.

42. A method of measuring performance of an imaging optical system, said method comprising the steps of:

measuring, by use of an interferometer, transmission wavefronts in relation to at least one of plural measurement points defined along a plane perpendicular to an optical axis of the imaging optical system;

calculating wavefront aberration of the imaging optical system on the basis of information regarding the transmission wavefronts measured in said measuring step and the position coordinates of the plural measurement points; and calculating the wavefront aberration at each measurement point, while taking, as a reference, the wavefront aberration at a standard point set along a plane perpendicular to the optical axis.

* * * * *

UNITED STATES PATENT AND TRADEMARK OFFICE
CERTIFICATE OF CORRECTION

PATENT NO. : 6,937,345 B2
DATED : August 30, 2005
INVENTOR(S) : Yoshiyuki Kuramoto It is certified that error appears in the above-identified patent and that said Letters Patent is hereby corrected as shown below:

<u>Title page,</u>
Item [56], References Cited, U.S. PATENT DOCUMENTS, insert:
-- 2004/0036883 A1    2/2004    Murakami et al.    356/450 --.

<u>Column 2,</u>
Line 46, "unit 18-23" should read -- units 18-23 --.

<u>Column 5,</u>
Line 33, "examined," should read -- examined. --.

<u>Column 11,</u>
Line 2, "it through" should read -- it passes through --.

Signed and Sealed this

Twenty-seventh Day of December, 2005

JON W. DUDAS
*Director of the United States Patent and Trademark Office*